(12) United States Patent
Parker

(10) Patent No.: US 6,614,683 B1
(45) Date of Patent: *Sep. 2, 2003

(54) ASCENDING STAIRCASE READ TECHNIQUE FOR A MULTILEVEL CELL NAND FLASH MEMORY DEVICE

(75) Inventor: Allan Parker, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/794,480

(22) Filed: Feb. 26, 2001

(51) Int. Cl.[7] ............................................. G11C 16/04
(52) U.S. Cl. .............................. 365/185.03; 365/185.19
(58) Field of Search ........................ 365/185.03, 185.08, 365/185.17, 185.18, 185.19, 185.21, 185.29, 185.33

(56) References Cited

U.S. PATENT DOCUMENTS

| | | | | |
|---|---|---|---|---|
| 5,691,941 A | * | 11/1997 | Imamiya et al. | 365/185.17 |
| 5,978,267 A | * | 11/1999 | Chen et al. | 365/185.17 |
| 6,009,014 A | * | 12/1999 | Hollmer et al. | 365/185.33 |
| 6,097,638 A | * | 8/2000 | Himeno et al. | 365/185.21 |
| 6,307,783 B1 | * | 10/2001 | Parker | 365/185.17 |
| 6,330,189 B1 | * | 12/2001 | Sakui et al. | 365/185.17 |

OTHER PUBLICATIONS

"Flash Memory Goes Mainstream", Dipert et al, Intel Corp., IEEE Spectrum Oct. 1993.
"64 Megabit Mass Storage Flash Memory—Utilizing UltranAND Technology",Am30LV0064D, AMD–Utilizing UltraNAND Product Brief, Dec. 26, 2000.

* cited by examiner

Primary Examiner—Trong Phan

(57) ABSTRACT

A method for resolving data to one stored level of N possible stored levels in a multi-level memory includes receiving an access address associated with a memory location of the multi-level memory and applying an ascending staircase read voltage to a word line associated with the access address. The method further includes detecting a sense signal produced on a sense line associated with the access address in response to the stored level and a value of the staircase read voltage, for each value of the ascending staircase read voltage, storing data responsive to the sense signal, and after application of a final value of the ascending staircase read voltage, producing an N-bit value corresponding to the one stored level stored in the memory location.

22 Claims, 6 Drawing Sheets

ASCENDING STAIRCASE READ TECHNIQUE FOR A MULTILEVEL CELL NAND FLASH MEMORY DEVICE

RELATED APPLICATIONS

This application is related to application Ser. No. 09/794,485 entitled Descending Staircase Read Technique For a Multilevel Cell NAND Flash Memory Circuit, filed on even date herewith and commonly assigned to the assignee of the present application.

BACKGROUND

The present invention relates generally to memory devices. More particularly, the present invention relates to an ascending staircase read technique for a multi-level cell NAND flash memory device.

A variety of semiconductor memory devices have been developed for storage of information. Examples include volatile and nonvolatile memory. Nonvolatile memory provides a key advantage in that it retains stored data after power is removed from the device. One example of nonvolatile memory is flash memory. However, manufacture and operation of nonvolatile memory is generally more complex than for volatile memory. For all memory devices, important design goals are increased storage density and reduced read and write times.

A conventional memory device includes an array of storage cells memory cells. Each cell stores a single binary digit or bit of information. For example, in a flash memory, the threshold voltage of a transistor in the memory cell is adjusted according to the data stored. During a read cycle, the threshold voltage is sensed to resolved the state of the data stored. In a conventional binary memory, this data is conventionally described as having a state of logic 0 or logic 1. The array of storage cells is surrounded by circuits for reading and writing data and controlling operation of the memory device.

Recently, multi-level cells have been developed. Multi-level storage refers to the ability of a single memory cell to store or represent more than a single bit of data. A multi-level cell may store 2, 4, 8 . . . etc., bits in a single storage location.

Multi-level cell devices provide a substantial advantage by exponentially increasing the storage capacity of a memory device. However, multi-level cell devices present several challenges for developing circuit designs to access the memory cells. One such challenge is reliably and rapidly reading the data stored in a multi-level storage cell.

BRIEF SUMMARY

By way of introduction only, a method for resolving data to one stored level of N possible stored levels in a multi-level memory includes receiving an access address associated with a memory location of the multi-level memory and applying an ascending staircase read voltage to a word line associated with the access address. The method further includes detecting a sense signal produced on a sense line associated with the access address in response to the stored level and a value of the staircase read voltage, for each value of the ascending staircase read voltage, storing data responsive to the sense signal, and after application of a final value of the ascending staircase read voltage, producing an N-bit value corresponding to the one stored level stored in the memory location.

The foregoing discussion of the preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

Figure 1:
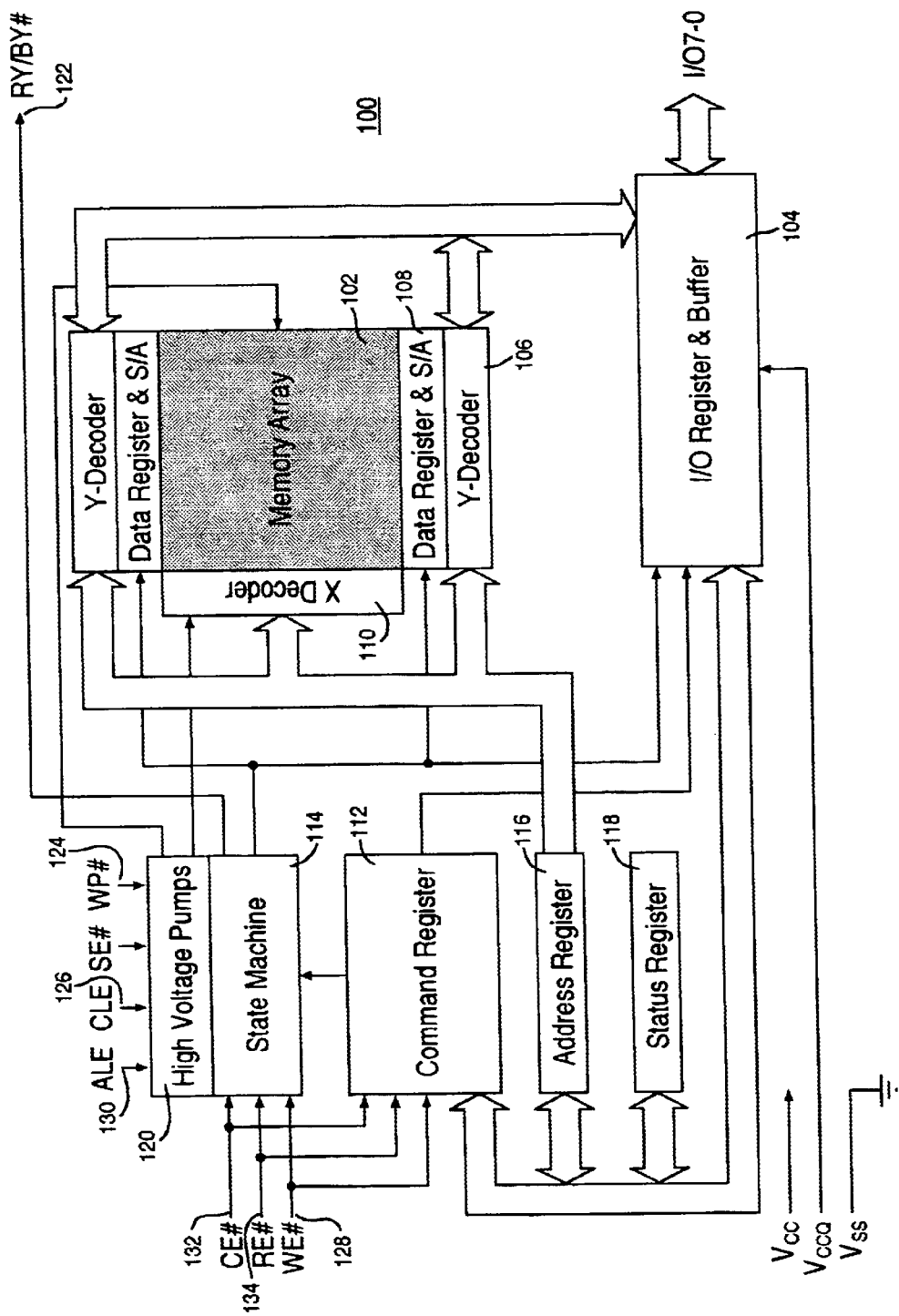
FIG. 1 is a block diagram of a memory device.

Referring now to the drawing, FIG. 1 shows a block diagram of a memory device 100. The memory device in the illustrated embodiment is a NAND flash memory. However, in other embodiments, the memory device 100 may be any other suitable type of volatile memory such as random access memory (RAM) including static or dynamic RAM or nonvolatile memory such as EEPROM. Further, the memory device 100 may be an embedded memory circuit within another integrated circuit or device containing other circuitry, such as logic. As a flash memory, the memory device 100 may be written or programmed with data, read to retrieve the stored data, and erased to clear the memory device on a block-by-block basis.

In the illustrated embodiment, the memory device 100 includes a memory cell array 102, an input/output (I/O) register, 104, one or more Y-decoders 106, one or more data register sense amplifier blocks 108 and one or more X-decoders 110. Further, the memory device 100 includes a command register 112, a state machine 114, an address register 116, a status register 118 and a high voltage circuit 120. Other embodiments of the memory device 100 may include other components or omit some of those illustrated in FIG. 1.

The memory cell array 102 includes a plurality of memory cells arranged in an ordered array of rows and columns. Each memory cell is independently addressable and may be programmed or written with data and read or sensed. In response to a received address, the X-decoder 110 selects one or more rows of the memory cell array 102 for access. Similarly, the Y-decoder 106 selects one or more columns of the memory cell array 102 for access. Sense amplifiers in the sense amplifier block 108 detect the state of the data stored in the accessed memory cell or cells. Data registers of the sense amplifier block 108 store data immediately prior to writing or immediately after reading the accessed memory cell or cells.

Address information and data to be stored, along with commands for controlling operation of the memory device 100, are provided to the memory device 100 using the I/O register 104 in a time multiplexed manner known in the art. Commands are written to the command register 112 using the I/O register 104. Address information corresponding to one or more memory cells to be accessed are stored in the address register 116. Status information is stored in the status register 118. Register contents serve as inputs to the state machine 114 which controls read, erase and programming of the memory device 100. The state machine 114 performs embedded programs to complete reading, erasing and programming automatically without user interaction.

Reading data is done according to standard NAND flash operation. A starting address is provided to the I/O register 104 along with the appropriate command. The associated memory cells are accessed and a page of data is transferred to the I/O register 104. A page may be any suitable size, such as 264 bytes. After an initial page read access time, such as 6 microseconds, the memory device 100 under control of the state machine 114 automatically increments the address register to the next address location in response to a received clock signal.

Erasing operations are performed on a block basis. A block may be any suitable size, such as 16 rows by 256 WORDS per row. The state machine 114 initiates an embedded erase algorithm to automatically time erase pulse widths and verify proper cell erase margin. The memory device 100 signals completion of an operation such as a read, write or erase using a read/busy (RY/BY) pin 122. The signal at the ready/busy pin 122 indicates operation status of the memory device 100. When this signal is high, the memory device 100 is ready to accept commands and data for a next operation. When the signal at the pin 122 is low, an internal operation is in progress.

To complete the identification of elements shown in FIG. 1, the high voltage circuit 120 generates the voltages necessary for proper reading, programming and erasure of the memory device 100. The memory device 100 operates in response to power supply (Vcc and Vccq) and ground (Vss) voltages. Typical power supply voltage is 3.0 volts, but other voltages may be used. A write protect (WP) input pin 124 provides hardware data protection. When a write protect signal is asserted at pin 124, program and erase operations are inhibited.

A command latch enable (CLE) pin 126 receives a signal which controls activation of the command register 112 for the receipt of commands. When this signal is high, the command is latched into the command register 112 on the rising edge of the write enable signal received at the write enable (WE) pin 128. A signal at an address latch enable (ALE) input 130 controls activation of the address register 116 during a data input operation. When the ALE signal is high, the address information is latched on the rising edge of the write enable (WE) signal at pin 128. When ALE is low, the input data information latched on the rising edge of the write enable signal. The signal at the chip enable (CE) input 132 controls the mode, either active or standby, of the memory device 100. The signal at the read enable (RE) input 134 controls serial data output and status from the input/output lines. Lastly, the signal at the spare area enable (SE) input 136 controls access to a spare storage area on each page. When the spare area signal is high, the spare area is not enabled.

Figure 2:
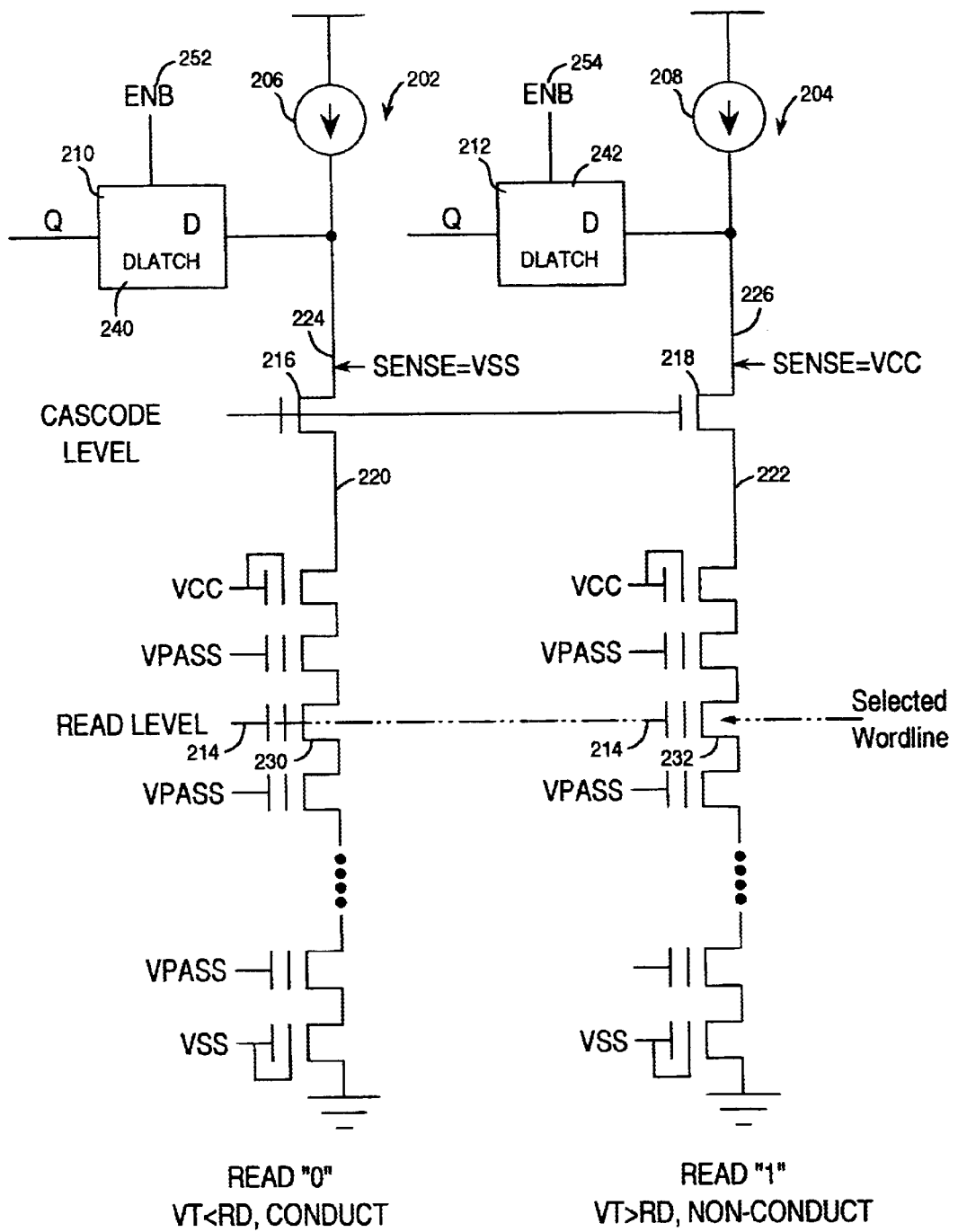
FIG. 2 is a simplified block diagram illustrating a read operation in the memory device of FIG. 1.

FIG. 2 is a simplified block diagram illustrating a read operation in the memory device of FIG. 1. FIG. 2 shows two columns including a first column 202 and a second column 204 of the memory cell array 102. Each column 202, 204 includes a column current source 206, 208, respectively, bit line buffer logic 210, 212 respectively, a cascode transistor 216, 218, and a plurality of memory cells.

The cascode transistors 216, 218 have respective sources coupled to the bit lines 220, 222, respectively, and respective drains coupled to the sense lines 224, 226. The gates of the cascode transistors 216, 218 are coupled to a reference potential. The cascode transistors 216, 218 form cascode amplifiers to amplify the current in the bit line due to a selected memory cell for sensing at the sense lines 224, 226 at the cascode level.

"Also, shown in FIG. 2 is latch enable (ENB) inputs 252 and 254."

As noted above in connection with FIG. 1, the memory cells are arranged in an array of rows and columns. In a typical embodiment, there are 16 memory cells per column and 264 memory cells per row. The rows are interconnected by word lines including a word line 214 shown in FIG. 2. As illustrated schematically in FIG. 2, each memory cell of the flash memory includes a floating gate for storage of charge. By controlling the charge stored on the floating gate, the threshold voltage of the memory cell is adjusted. When the voltage on the word line is raised above the threshold voltage of the memory cell, the memory cell transistor conducts current. For reading the data stored in a selected memory cell, other transistors in the column are supplied with a voltage Vpass so that these transistors act as pass transistors, conducting the current sunk in the memory cell to the bit lines 220, 222. This current is amplified by the cascode transistors 216, 218.

Two examples of reading data are illustrated in FIG. 2. In column 202, transistor is selected by driving the word line 214 to a read voltage. This same voltage is applied to all memory cells coupled to the word line 214, such as transistor 232 in column 204. In the memory cell 230, the threshold voltage Vt of the cell is less than the applied read voltage (RD). Therefore, the memory cell 230 will conduct a read current on the order of a few microamps. This current in the bit line 220 is amplified by the cascode transistor 216 and the sense line 224 is pulled low to a voltage of approximately Vss. The bit line buffer circuitry 210, embodied here as a D latch 240, will store the state of the sense line 224 and the data may be read from the latch 240.

In column 204, the threshold voltage Vt of the memory cell 232 is greater than the applied read voltage (RD) on the word line 214. As a result, the memory cell 232 will conduct substantially no current. With no current in the bit line 222, the voltage on the sense line 226 remains high or approximately Vcc. Again, the bit line buffer circuitry 210 is embodied as a D latch 242 which stores the state of the sense line 226 for subsequent reading.

Figure 3:
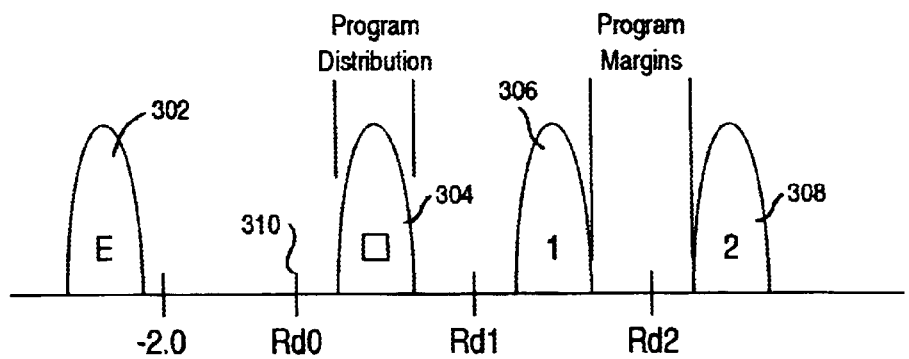
FIG. 3 illustrates relative threshold voltage levels for storing data in a multi-level memory cell of the memory device of FIG. 1.

FIG. 3 illustrates relative threshold voltage levels for storing data in a multi-level memory cell of the memory device of FIG. 1. In the example of FIG. 3, the number of bits stored per cell is N=2 so the number of possible threshold voltage values is 2 to the power of N or 4. It is recognized that during the programming operation, a programmed threshold voltage in a given memory cell will actually fall within a program distribution of voltages about a nominal or mean voltage. Thus, the example threshold voltage levels are shown as four voltage distributions. The distributions and their associated data states are as shown in FIG. 3. The erased data state or E has the most negative programmed threshold voltage in a distribution 302 so that erased memory cells will always conduct. A data state of 0 has the next highest programmed threshold voltage, in a distribution 304. A data state of 1 has the next highest programmed threshold voltage, in a distribution 306. A data state of 1 has the highest programmed threshold voltage, in a distribution 308. FIG. 3 also illustrates the program margins between the individual program voltages.

FIG. 3 further shows the read levels required to resolve the data stored in a given memory cell. A first read level 310 labelled Rd0 is used to discriminate the stored 0 data from an erased state. That is, a voltage Rd0 is applied to the word line of the memory cell to be sensed. If the memory cell stores an erased state E, the threshold voltage of the memory cell will be in the distribution 302 and therefore less than the applied voltage Rd0. The memory cell will conduct current. On the other hand, if the memory cell stores the data 0 state, the threshold voltage will be in the distribution 304 and therefore greater than the applied voltage Rd0. The memory cell will not conduct current. Similar conditions apply for using a read voltage Rd1 to discriminate the stored date 1 state, with a threshold voltage in the distribution 306, from the stored data 0 state with a threshold voltage in the distribution 304, and using a read voltage Rd2 to discriminate the stored data 2 state, with a threshold voltage in the distribution 308, from the stored data 1 state, with a threshold voltage in the distribution 306.

Figure 4:
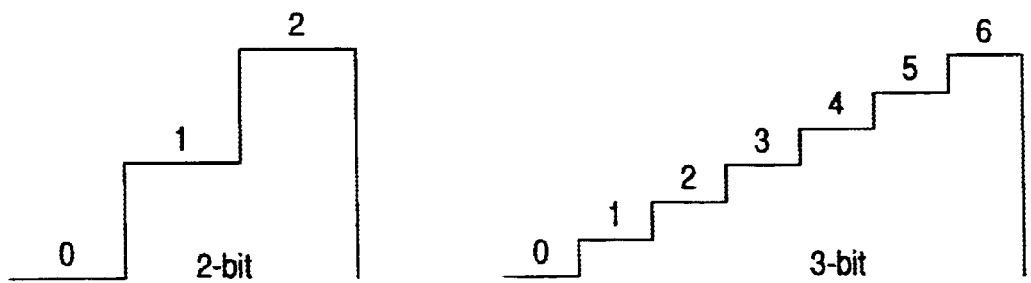
FIG. 4 illustrates two examples of a stair case read pulse signal for reading data in a multi-level memory cell.

FIG. 4 illustrates two examples of an ascending stair case read pulse signal for reading data in a multi-level memory cell. In each example, the stair case read pulse signal increments from an initial level to a final level in substantially equal steps. In FIG. 4, the stair case read pulse signals are shown as voltages plotted against time. However, it is to be understood that any suitable stair case signal such as a current or other electrical parameter established by one or more circuit or logic elements could be used. Further, in the exemplary embodiment of FIG. 4, each step of the 2N−1 total steps is generally equal in voltage and in time duration, where N is the number of bits stored in the multi-level memory cell. It is further to be understood that pulses which vary in size or duration may be substituted in appropriate designs.

Figure 5:
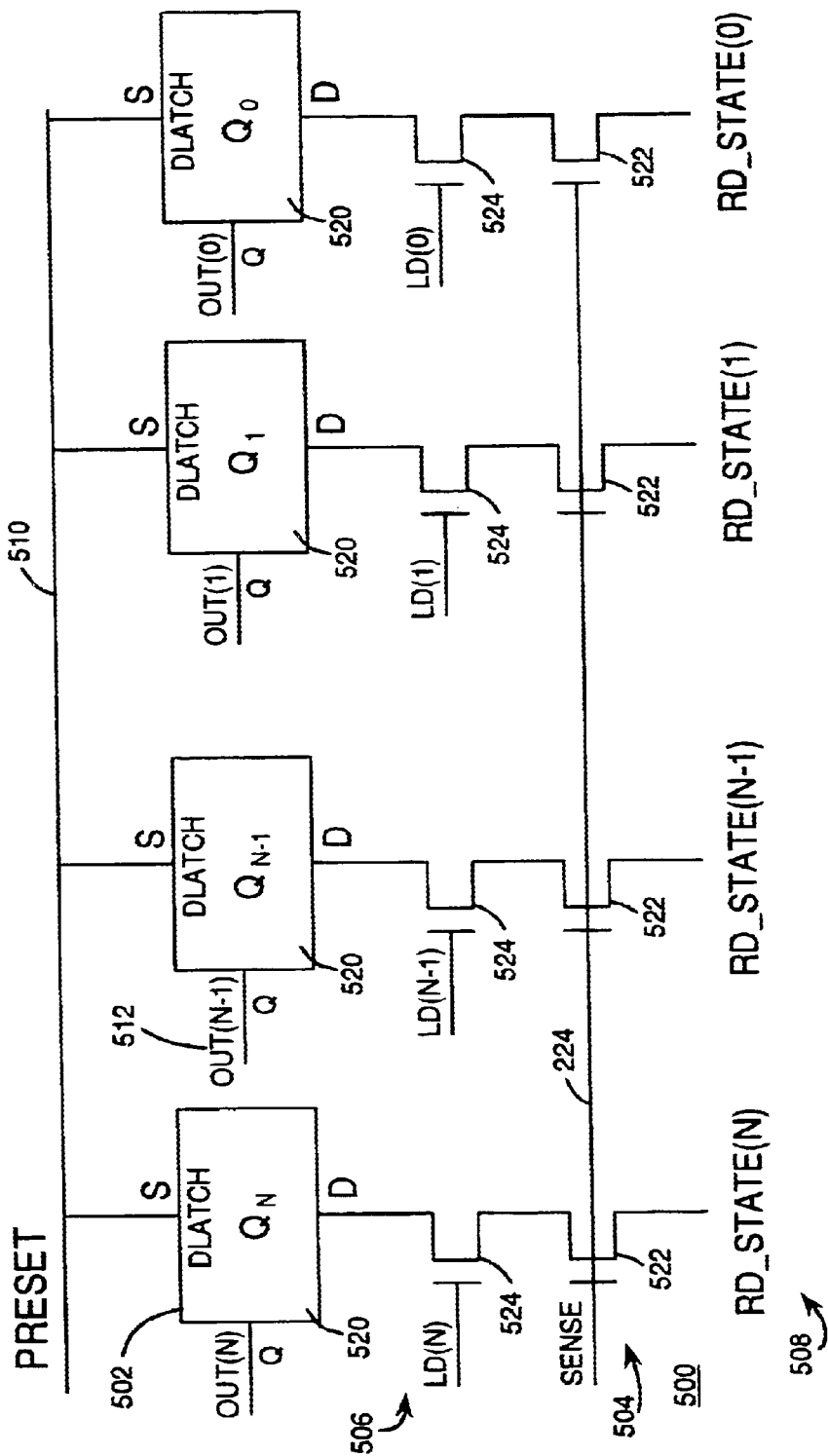
FIG. 5 illustrates bit line buffer logic in the memory device of FIG. 1.

FIG. 5 is a block diagram of bit line buffer logic 500 for use with the memory device 100 of FIG. 1. The bit line buffer logic 500 includes a latch circuit 502, a switch circuit 504 and a load circuit 506. The bit line buffer logic 500 receives as inputs a sense signal on sense line 224, a read state signal RD_STATE(N:0) on a read state bus 508 and a preset signal on a preset line 510. The bit line buffer logic 500 provides as an output an N-bit output signal on an output bus 512. The output signal is a binary signal associated with the stored level in the memory cell currently being sensed by the sense line 224. The output signal may be provided to other circuits of the memory 100 (FIG. 1), for example, the I/O register 104 as output data read from the memory device 100.

The latch circuit 502 includes N latches 520, where N is the number of bits represented by 2N stored levels in a memory cell of the memory device 100 (FIG. 1). Each latch 520 is generally identical in the illustrated embodiment. Each latch 520 is a D-type latch and has a data input labeled D, a data output labeled Q and a set input labeled S. In response to a preset signal received at the set input, the data stored in the latch 520 is initialized to a predetermined value. In the illustrated embodiment, the predetermined value corresponds to a logic 1 value. When a data signal is provided to the data input, the logic value is stored in the latch 520 and made available at the data output Q.

As noted, in the illustrated embodiment, D-type latches are used to form the latch circuit 502. In other embodiments, other types of storage devices could be used as well. Examples include master-slave flip flops and simple devices such as flash memory cells. Selection of a storage device for use in the bit line buffer logic 500 may be made according to performance and control requirements.

The switch circuit 504 includes a plurality of switch transistors 522. In the illustrated embodiment, the switch transistors 522 are formed using n-channel field effect transistors having a gate coupled to the sense line 224, a drain coupled to the load circuit 506 and a source coupled to the read state bus 508. In alternative embodiments, other devices could be used to form the switch circuit 500 to provide additional control or performance features. N-channel transistors are preferred because of their fast switching speed and small size. The switch circuit 504 is responsive to a sense voltage on the sense line 224 for selectively storing values of the read state signals on the read state bus 508. The switch circuit 504 allows the data stored in a selected multi-level memory cell to be resolved.

The switch circuit 504 controls storage in the latch circuit 502 in response to the value on the sense line 224. The value on the sense line 224 is typically either Vcc or Vss, the supply voltages of the memory device 100. The value on the sense line 224 will be Vcc if the threshold voltage of the selected memory cell is greater than the read voltage applied on the selected word line. In that case, the switch transistors 522 will be turned on and data from the read state bus 508 will be passed through the switch transistors 522. The value on the sense line 224 will be Vcc if the threshold voltage of the selected memory cell is less than the read voltage applied on the selected word line. In that case, the switch transistors 522 will be turned off and no value will pass through the switch transistors 522 from the read state bus 508 to the load circuit 506.

The load circuit 506 includes load transistors 524. The load transistors 524 each have a gate coupled to a load bus labeled LD(N) through LD(0), a source coupled with the drain of a corresponding switch transistor 522 and a drain coupled with the data input D of a corresponding data latch 520. When the load signal at the gate of the load transistor 524 is driven to a logic 1 value, the load transistor 524 turns on, coupling the corresponding switch transistor 522 to the corresponding latch 520. If both the sense signal on the sense line 224 and the respective load signal has a logic 1 value, data bits from the read state bus 508 are loaded into the D-type latches of the latch circuit 502.

The load circuit 506 is shown including only n-channel transistors. Again, this is preferred for small size and fast operation. In other embodiments, other devices may be used to perform the function of the switch circuit 506. In addition, in the embodiment of FIG. 5, the load signal is shown as a multi-bit signal LD(N:0) having 4 bits, one for each latch 520. In alternative embodiments, the load signal may be a single binary signal which controls all switch transistors 524.

In operation, at the beginning of a read cycle, the preset signal is asserted at the set inputs of the latches 520. This initializes the data stored in the latch circuit 502 and presented at the output bus to all logical 1 values. In the illustrated embodiment, this all-ones value corresponds to a stored Erase or E level in the selected multi-level memory cell. Other default values could be chosen. However, the choice illustrated here reduces the number of values of the ascending staircase read voltage that must be applied to resolve the data stored in the multi-level memory cell.

The state machine 114 (FIG. 1) forms a control circuit or control means for controlling a read cycle. Other on-chip or off-chip circuitry or hardware combined with software can perform the same or equivalent function. During the read cycle, the state machine 114 applies a variable read voltage to a word line associated with the selected memory cell. The state machine 114 controls a circuit such as the high voltage circuit 120 (FIG. 1) to generate a variable voltage which steps through the levels or values of the ascending staircase read voltage appropriate for the memory device 100, such as those illustrated in FIG. 4. The state machine 114 provides the necessary control signals to control generation of appropriate voltage levels with appropriate timing.

Substantially simultaneously, the state machine 114 provides counterpart values to the read state bus RD_STATE (N:0). The read state signal is applied with a value related to the read voltage applied to the word line associated with the selected memory cell.

Figure 6:
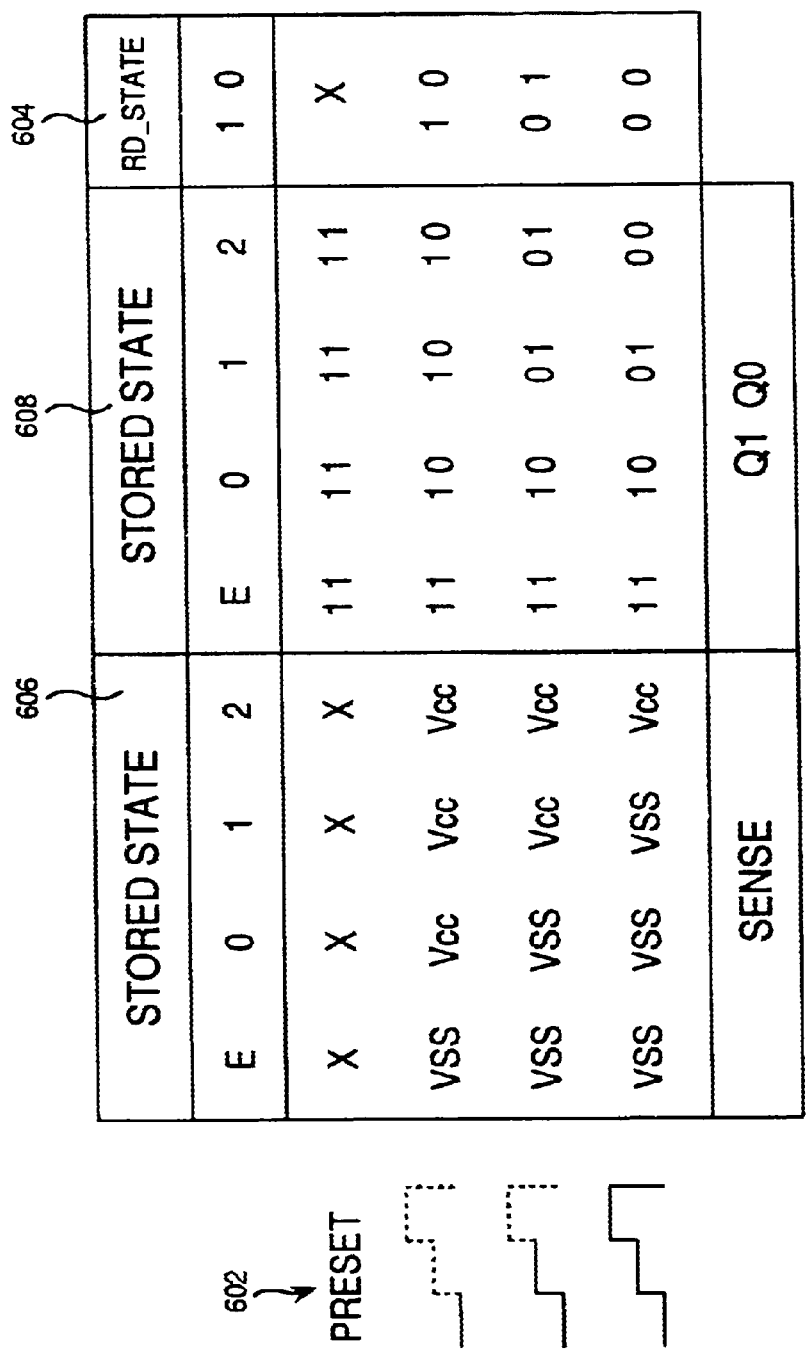
FIG. 6 is a table illustrating voltages and logic states during application of a stair case read pulse signal for reading data in a multi-level memory cell of the memory device of FIG. 1.

This operation is illustrated in FIG. 6, which is a table illustrating voltages and logic states during application of an ascending stair case read pulse signal for reading data in a multi-level memory cell of the memory device of FIG. 1. In the example of FIG. 6, N=2. The applied read voltage 602 is illustrated on the left hand side of FIG. 6. The applied read state bus logic levels RD_STATE(1) and RD_STATE(0) 604 are illustrated on the right hand side of FIG. 6. The four columns 606 to the left of the center of FIG. 6 illustrate the value of the sense line 224 for each possible stored level in the selected memory cell, E, 0, 1, 2. The four columns 608 to the right of the center of FIG. 6 illustrate the data produced at the outputs Q1, Q0 of the latches 520.

Initially, the preset signal is applied to the latches, setting their stored values to all logic 1 values. During present, the state of the sense signal is not read so it is shown in FIG. 6 with values of X or don't care for each of the possible stored levels, E, 0, 1, 2.

Next during the read cycle, a read voltage with a first or smallest voltage at a first step is applied to the selected word line. If the stored state in the selected memory cell is Erase or E, the sense signal on the sense line 224 will have the value Vss. In this case, the Erase threshold voltage is less than the applied read voltage and the memory cell conducts, pulling the voltage on the sense line 224 to a logic 0 value. The read state bus has value (1,0). However, if the sense signal has a logic 0 value, the sense transistors 522 (FIG. 5) do not turn on so the data latched in the latches 520 remains unchanged. Similarly, the data output Q1, Q0 remains unchanged at (1,1). Alternatively, if the stored state in the selected memory cell is other than Erase, the sense signal on the sense line 224 has the value Vcc as the memory cell threshold voltage exceeds the applied read voltage on the word line.

At this read voltage level, the corresponding read state signal is (1,0). The data value of (1,0) on the read state is passed by the switch circuit 504 and the load circuit 506 and latched in the latch circuit 502. That is, the logic 1 value in the most significant bit position Q1 remains unchanged and the logic 1 value in the least significant bit position Q0 is overwritten to a logic 0. This is reflected in the output data of (1,0).

Next during the read cycle, the variable read voltage applied to the word line is advanced to a next or second step or voltage. At this value of the ascending staircase read signal, the word line voltage exceeds the memory cell threshold voltage if the memory cell stores either an Erase or 0 level. In these two cases, then, the sense signal value is Vss. If the stored level is 1 or 2, the sense signal value is Vcc.

At this read voltage level, the corresponding read state signal is (0,1). Thus, the most significant bit of the two-bit read state bus, RD_STATE(1), is a logic 0 and the least significant bit, RD_STATE(0), is a logic 1. If the stored level is a 1 or a 2, both the latches 520 will be updated. In that case, the data stored in the latches will match the applied read state signal with the 0 in the most significant bit position and 1 in the least significant bit position, producing output data (Q1,Q0)=(0,1). If the stored data is an Erase or 0 level, the latched data will be unchanged.

During the final portion of the read cycle, the variable read voltage applied to the word line is advanced to a next or third step or voltage. At this value of the ascending staircase read signal, the word line voltage exceeds the memory cell threshold voltage if the memory cell stores either an Erase, 0 or 1 level. In these three cases, then, the sense signal value is Vss. If the stored level is 2, the sense signal value is Vcc.

At this read voltage level, the corresponding read state signal is (0,0). Thus, both the most significant bit of the two-bit read state bus, RD_STATE(1), and the least significant bit, RD_STATE(0), are a logic 0. If the stored level is a 2, Q1 and Q0 latch will be updated to (0,0). In that case, the data stored in the latches will match the applied read state signal with the 0 in the most significant bit position and 0 in the least significant bit position, producing output data (Q1,Q0)=(0,0). If the stored data is an Erase, 0 or 1 level, the latched data will be unchanged.

Figure 7:
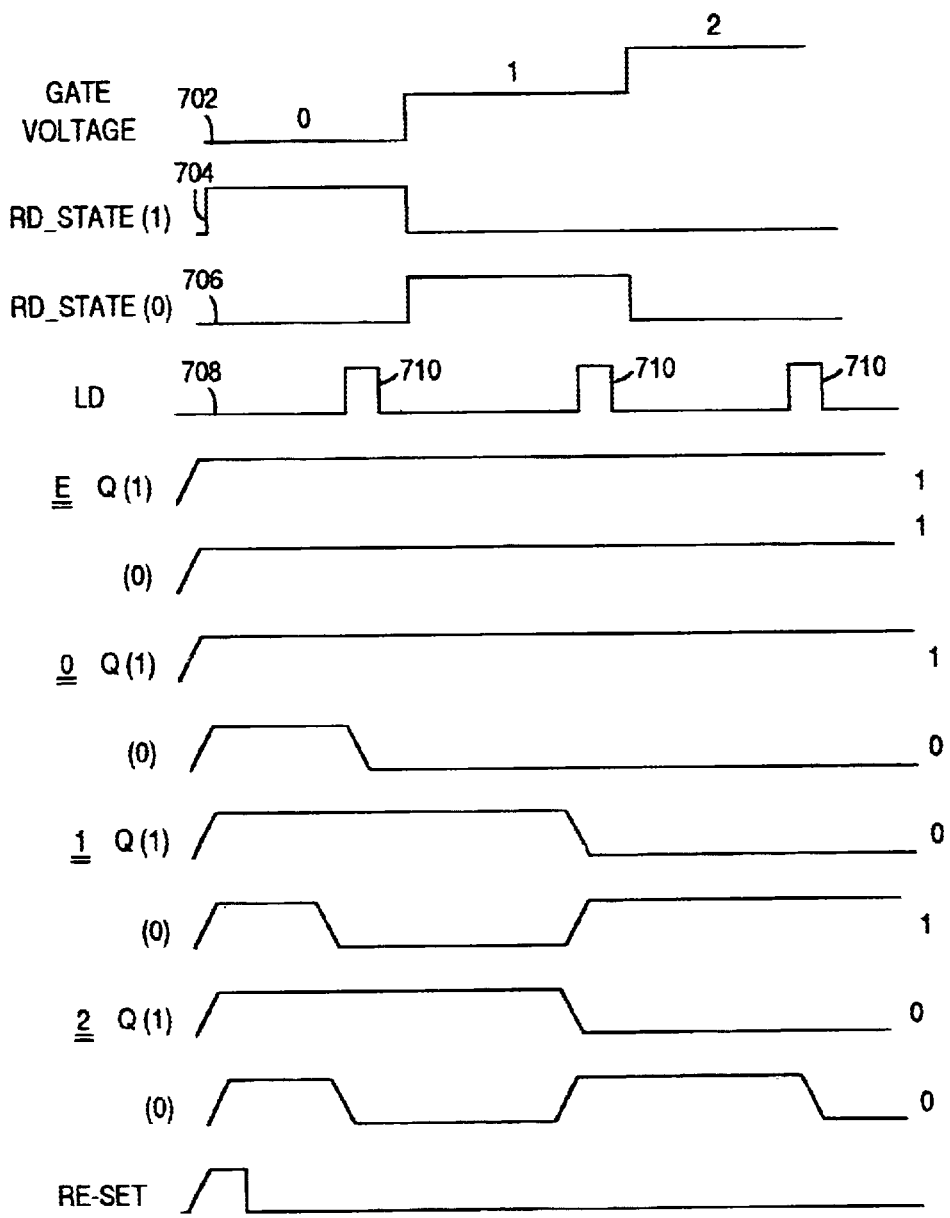
FIG. 7 is a timing diagram illustrating read operation of the memory device of FIG. 1.

FIG. 7 is a timing diagram illustrating read operation of the memory device 100 of FIG. 1. FIG. 7 illustrates several voltage signals versus time during a read cycle of the memory device 100. FIG. 7 is best understood in conjunction with the bit line buffer logic 500 of FIG. 5.

In FIG. 7, a read voltage or gate voltage 702 is applied to the selected word line 214 as an ascending staircase read pulse signal. A read state signal having two components, RD_STATE(1) 704 and RD_STATE(0) 706 is applied with a value or respective values related to the read voltage 702. At the end of each portion of the read cycle, a load pulse 710 of the load signal LD 708 is applied to the load transistors 524 of the load circuit 506 to load the data from the switch circuit 504 to the latch circuit 502. At the bottom of FIG. 7, a present signal 712 initiates a read cycle by pulsing to a logic 1 to set all the latches 520.

The lower portion of FIG. 7 illustrates the latched and output data values (Q1, Q0) for the $2^N=4$ different possible stored levels in the selected memory cell. Thus, for example, if the stored level is an erase or E, Q1 and Q0 are initially preset to logic 1 values and remain unchanged thereafter throughout the duration of the read cycle. If the stored level is other than an erase, the stored values are updated with each load pulse as shown in FIG. 7. At the end of the read cycle, on the left hand side of FIG. 7, the data stored in the multi-level memory cell is available for reading.

From the foregoing, it can be seen that the present embodiments provide an improved technique for resolving the data stored in a multi-level memory cell. An ascending staircase read signal is applied to the selected word line and an associated read state signal is applied to the bit line buffer logic to store the sense signals produced in response to the read signal. The staircase read technique provides a significant advantage by reducing the bit line buffer circuitry. There is no need for feedback between logical bits as in prior designs. In one embodiment, the circuit reduction accounts for twenty to thirty percent area savings in the bit line buffers, which is important for reducing the manufacturing cost of the memory device. Further, performance is improved as the staircase read technique encounters bit line preparation, setup time and hold time penalties only once per read cycle. This results in significant read access time savings for the memory device. The staircase read scheme is scalable to any multi-level cell density, such as 2, 3, 4, etc., times the initial number of stored levels per memory cell. The shape of the staircase read voltage may be controlled through the state machine of the memory and thus can be easily modified.

While a particular embodiment of the present invention has been shown and described, modifications may be made. For example, the sense of the individual transistors, p-channel and n-channel, may be reversed in suitable applications or other technologies may be substituted. It is therefore intended in the appended claims to cover all such changes and modifications which fall within the true spirit and scope of the invention.

I claim:

1. A memory comprising:

a plurality of multi-level memory cells accessible through respective word lines and sense lines;

a control circuit which controls application of a read voltage to a selected word line and a read state signal to a selected sense line; and a switch circuit responsive to the sense voltage present on a selected sense line that is produced in response to the current level present in a bit line of a selected memory cell.

2. The memory of claim 1 further comprising a latch circuit coupled with the switch circuit to store the values of the read state signal.

3. The memory of claim 2 wherein the latch circuit comprises N latches for storing N stored levels of the data stored in the selected multi-level cell.

4. The memory of claim 3 wherein the N latches each comprises a preset input configured to receive a preset signal to initialize the N latches to an initial value.

5. The memory of claim 4 wherein the N latches are configured to initialize data stored in the N latches to a value corresponding to an Erase value of the data stored in the multi-level memory cell.

6. The memory of claim 3 wherein the switch circuit comprises N pass transistors gated by the sense voltage.

7. A method for resolving data stored in a memory cell of a multi-level memory capable of storing N stored levels, the method comprising:

applying a variable read voltage to a word line associated with the memory cell;

applying a read state signal with a value related to the read voltage to a bit line buffer circuit associated with the memory cell;

detecting a sense voltage at the bit line buffer circuit responsive to the read voltage and the read state signal;

incrementing the read voltage and the read state signal to detect a next stored level of the memory cell; and switching a switch in response to the sense voltage present on a selected sense line that is produced in response to the current level present in a bit line of a selected memory cell.

8. The method of claim 7 further comprising generating the sense voltage responsive to read current in the memory cell.

9. The method of claim 8 wherein detecting a sense voltage comprises:

under control of the sense voltage, applying bits of the read state signal to a logic circuit.

10. The method of claim 8 further comprising storing the bits of the read state signal only when the sense voltage has a first level.

11. The method of claim 7 further comprising:

producing the sense voltage in response to a read current in the memory cell;

applying the sense voltage to a switch circuit to selectively control storage of data in a latch circuit responsive to the read state signal.

12. The method of claim 11 further comprising:

initially, presetting the latch circuit;

updating the stored data in the latch circuit before incrementing the read voltage and the read state signal.

13. The method of claim 7 further comprising:

storing the sense voltage in a latch circuit;

incrementing the read voltage and the read state signal through a set of predetermined values; and updating the sense voltage after each incrementing to resolve the data stored.

14. The method of claim 13 further comprising:

incrementing the read voltage and the read state signal for a total of N−1 applications of the read voltage and the read state signal.

15. A method for resolving data to one stored level of N possible stored levels in a multi-level memory, the method comprising:

receiving an access address associated with a memory location of the multi-level memory;

applying an ascending staircase read voltage to a word line associated with the access address;

detecting a sense signal produced on a sense line associated with the access address in response to the stored level and a value of the staircase read voltage;

switching a switch in response to the sense signal present on a selected sense line that is produced in response to a current level present in a bit line of a selected memory cell;

for each value of the ascending staircase read voltage, storing data responsive to the sense signal; and after application of a final value of the ascending staircase read voltage, producing an N-bit value corresponding to the one stored level stored in the memory location.

16. The method of claim 15 wherein applying an ascending staircase read voltage comprises applying N−1 values of the ascending staircase read voltage.

17. The method of claim 15 wherein detecting a sense signal comprises:

producing one of a logic 1 value or a logic 0 value in response to a current in the memory location.

18. The method of claim 17 wherein detecting a sense signal comprises:

applying the current to at least one cascode transistor; and sensing a voltage produced by the at least one cascode transistor in response to the current.

19. The method of claim 15 wherein storing data comprises:

producing a multi-valued read state signal, each value of the read state signal corresponding to a value of the ascending staircase read voltage;

in response to each value of the read state signal, updating the N-bit value using the sense signal.

20. The method of claim 19 further comprising:

storing the N-bit value in a latch circuit.

21. The method of claim 20 further comprising:

presetting the latch circuit to a predetermined value corresponding to one stored level of the N possible stored levels.

22. A memory device comprising:

a plurality of memory cells, each memory cell capable of storing one of N possible levels;

a decoder for selecting a row line associated with a selected address and a sense line associated with the selected address;

control circuitry operational during a read mode for applying consecutive values of an ascending staircase read voltage to the selected row line and providing consecutive values of a multi-bit read state signal; logic circuitry coupled to the control circuitry and the decoder for storing in the memory device for storing data respective values of the read state signal for each respective value of the ascending staircase read voltage; and switching circuitry responsive to the sense voltage present on a selected sense line that is produced in response to the current level present in a bit line of a selected memory cell.

* * * * *